United States Patent [19]

Kurata et al.

[11] Patent Number: 4,593,305
[45] Date of Patent: Jun. 3, 1986

[54] HETEROSTRUCTURE BIPOLAR TRANSISTOR

[75] Inventors: Mamoru Kurata, Tokyo; Jiro Yoshida, Yokohama, both of Japan

[73] Assignee: Kabushiki Kaisha Toshiba, Kawasaki, Japan

[21] Appl. No.: 608,217

[22] Filed: May 8, 1984

[30] Foreign Application Priority Data

May 17, 1983 [JP] Japan ................... 58-86063
May 17, 1983 [JP] Japan ................... 58-86069
May 17, 1983 [JP] Japan ................... 58-86072

[51] Int. Cl.$^4$ ............... H01L 29/72; H01L 29/205
[52] U.S. Cl. ........................ 357/34; 357/16; 357/89
[58] Field of Search ............... 357/16, 34, 89

[56] References Cited

U.S. PATENT DOCUMENTS 3,980,900  9/1976  Ishigaki et al. ............ 357/89
4,302,763  11/1981  Ohuchi et al. ............ 357/16

OTHER PUBLICATIONS

H. Kroemer, Proc. IEEE, vol. 70, No. 1, Jan. 1982, pp. 13-25, "Heterostructure Bipolar Transistors and Integrated Circuits".
C. Y. Chen et al., IEDM 81, pp. 267-270, "A Depletion Stop Double Base Phototransistor: A Demonstration of a New Transistor Structure".

Primary Examiner—Martin H. Edlow
Assistant Examiner—Terri M. Henn
Attorney, Agent, or Firm—Oblon, Fisher, Spivak, McClelland & Maier

[57] ABSTRACT

A heterostructure bipolar transistor has an emitter layer, a base layer and a collector layer, the emitter layer being formed of a semiconductor material whose energy gap is wider than that of the base layer, so that a heterojunction is formed between the emitter layer and the base layer. One of the emitter layer and the base layer has first and second layers which are sequentially formed, and the first layer constituting the heterojunction has a lower impurity concentration than that of the second layer. When the impurity concentration and the thickness of the first layer are defined as $N_1$ and $W_1$, respectively, the following relation is satisfied:

$$N_1 W_1^2 \leq (2\epsilon_s\epsilon_0/q)V_{bi}$$

where
q: the absolute value of electron charge ($=1.6 \times 10^{-19}$ Coulombs),
$\epsilon_0$: the free space permittivity ($=8.86 \times 10^{-14}$ farads/cm),
$\epsilon_{s1}$: the dielectric constant of the first layer, and
$V_{bi}$: the built-in potential at the heterojunction.

9 Claims, 16 Drawing Figures

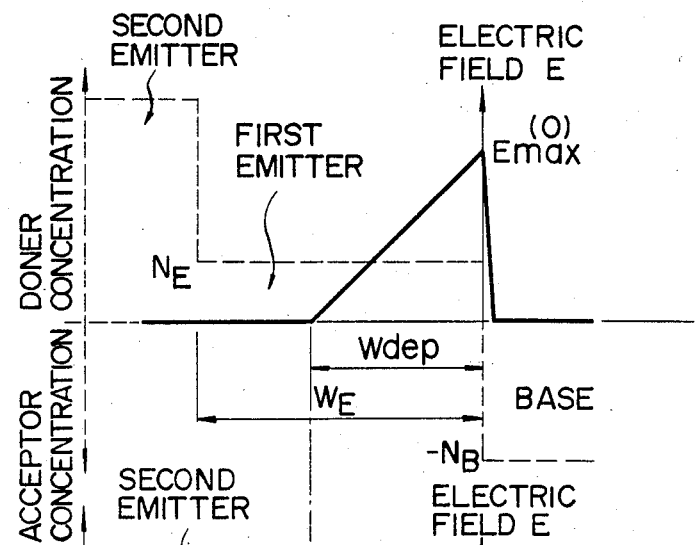
F I G. 5A
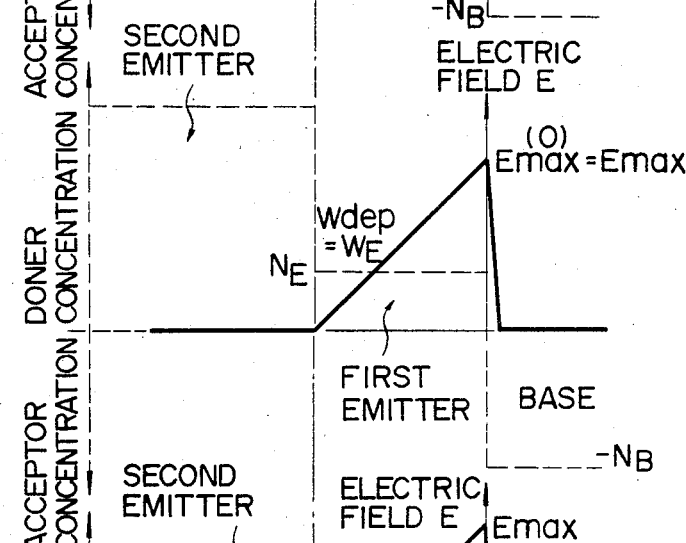
F I G. 5B
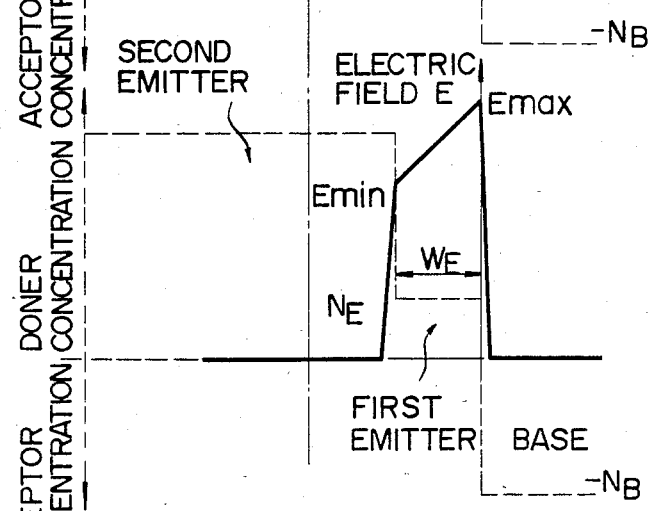
F I G. 5C

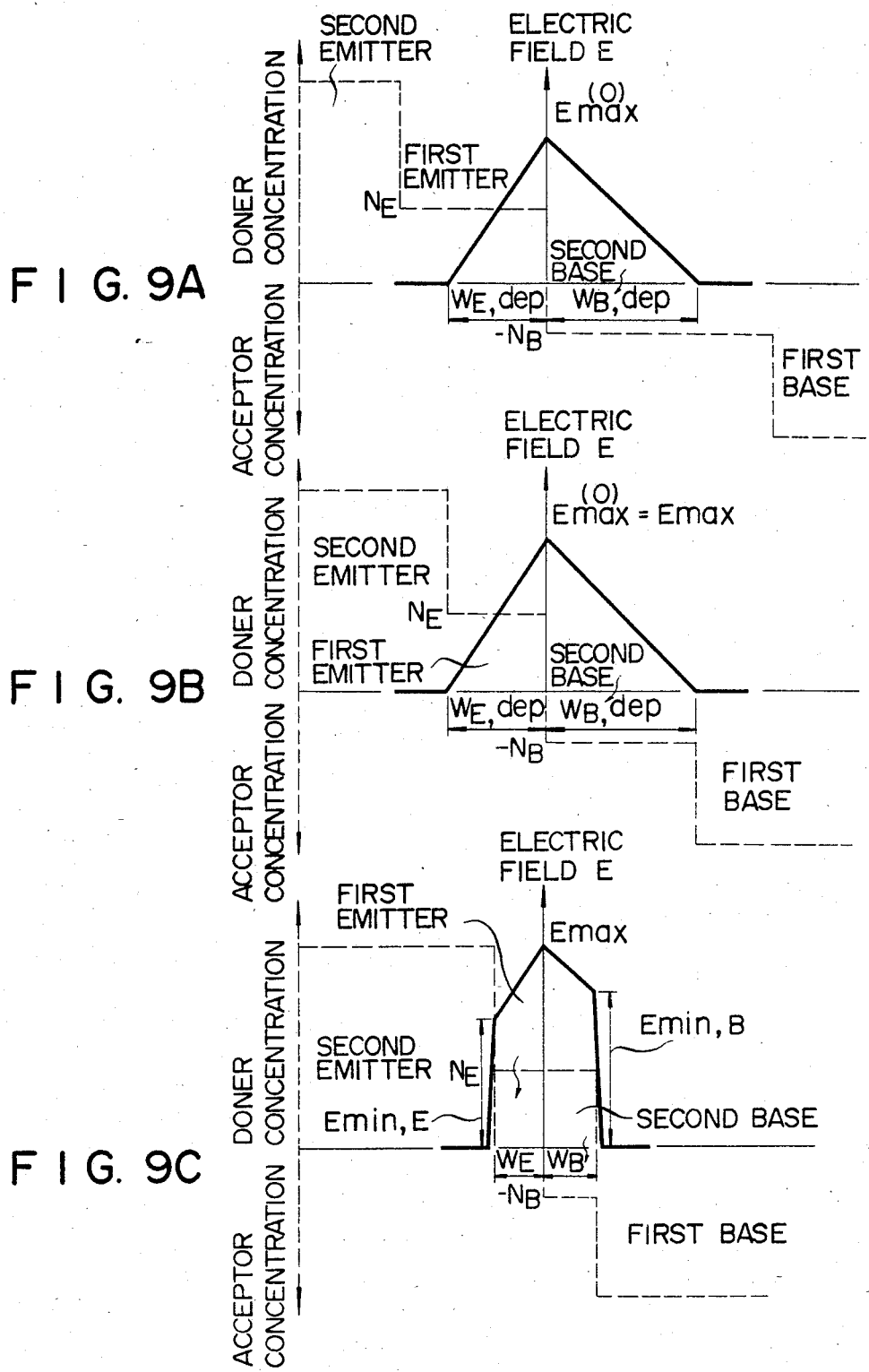
F I G. 9A
F I G. 9B
F I G. 9C

HETEROSTRUCTURE BIPOLAR TRANSISTOR

BACKGROUND OF THE INVENTION

The present invention relates to a heterostructure bipolar transistor using a heterojunction as an emitter-base junction.

A conventional bipolar transistor has an npn or pnp structure wherein emitter, base, and collector layers are made of a common semiconductor material. In this case, emitter and collector junctions are each a homojunction.

Bipolar transistors using a heterojunction as the emitter junction and/or collector junction are receiving a great deal of attention and are being extensively studied these days. The heterojunction bipolar transistor has an advantage in that, when the emitter layer is made of a semiconductor material having a wider energy gap than that of the base layer, the emitter injection efficiency can be enhanced. When the emitter junction is forward biased, carriers can be easily injected from the emitter to the base while carrier injection from the base to the emitter is limited due to an energy gap difference between the emitter and base layers. Therefore, a current gain of the heterostructure bipolar transistor becomes higher than that of the conventional homostructure type.

The principle of the heterostructure bipolar transistors has been conventionally known. Recently, several examples have been published. FIG. 1 shows the basic structure of conventional heterostructure bipolar transistors wherein a heterojunction is used as the emitter junction. This transistor comprises a GaAs-GaAlAs structure. An n-type GaAs collector layer 2, a p-type GaAs base layer 3, and an n-type $Ga_{1-x}Al_xAs$ emitter layer 4 are sequentially deposited on an $n^+$-type GaAs substrate 1. Reference numeral 5 denotes a collector electrode; 6, a base electrode; and 7, an emitter electrode. The emitter layer 4 comprises an $n^-$-type first emitter layer 4a which is in contact with the base layer 3, and an $n^+$-type second emitter layer 4b which is in contact with the emitter electrode 7. A common feature of conventional heterostructure bipolar transistors is in that the first emitter layer 4a is thick. The structure in which the emitter layer comprises a two-layer structure of high- and low-impurity concentration layers and the first emitter layer is thick aims at decreasing the emitter junction capacitance so that a switching speed is increased (e.g., H. Kroemer "Heterostrucure Bipolar Transistors and Integrated Circuits", Proc. IEEE, Vol. 70, No. 1, PP. 13-25, January 1982). In fact, when the low-impurity concentration layer has a sufficient thickness in a one-sided abrupt junction constituted by such high- and low-impurity concentration layers, it is known that a junction capacitance $C_{JE}$ can be expressed, in terms of an impurity concentration $N_E$ of the low-impurity concentration layer, as follows:

$$C_{JE} \propto N_E^{\frac{1}{2}}$$

In order to clarify the subsequent discussion, the concept of the switching speed of a transistor will be clarified. In general, the switching operation of transistors includes turn-on and turn-off. A propagation delay time $t_{pd}$, the average value of a turn-on time $t_{on}$ and a turn-off time $t_{off}$, is taken as a reference of the switching speed. When an input signal of FIG. 2 is supplied to a transistor, the turn-on time $t_{on}$ is defined to be a time for an ouput current to increase from 0% to 50%, and the turn-off time $t_{off}$ is defined to be a time for the output current to decrease from 100% to 50% (see FIG. 3).

The present inventors have made extensive studies of thicknesses of the respective layers and the relationship between the impurity concentration and the switching speed of the heterostructure bipolar transistor shown in FIG. 1, by means of a numerical analysis model (e.g., M. Kurata "Principles of Operation of Bipolar Transistors", 1980, Kindai Kagaku-sha, and M. Kurata, "Numerical Analysis for Semiconductor Devices", 1982, Lexington Books, D. C. Heath and Company). The present inventors have reached an opposite conclusion to the conventional theory. In particular, they found that the switching speed of the conventional transistor (to be referred to as type A hereafter) having the first emitter layer of a low-impurity concentration and a large thickness was greatly lower than that of a transistor (to be referred to as type B hereinafter) having only a single high-impurity concentration layer (omitting the first emitter layer). The results are shown in Table 1.

TABLE 1

| type | A | B |
|---|---|---|
| $V_{on}$ (V) | 1.5 | 1.3 |
| $J_E$ (A/cm$^2$) | $1.25 \times 10^4$ | $1.01 \times 10^4$ |
| $J_C$ (A/cm$^2$) | $8.90 \times 10^3$ | $9.59 \times 10^3$ |
| $t_{on}$ (psec) | 13.0 | 3.8 |
| $t_{off}$ (psec) | 159 | 14.5 |
| $t_{pd}$ (psec) | 86 | 9.2 |

In this numerical analysis, conditions are given in the circuit shown in FIG. 4 such that a collector power supply voltage $E_c=2$ V, a load resistance $R_L=200\Omega$, and an input signal voltage to turn transistor Q off $V_{off}=0.5$ V. An input signal voltage to turn transistor Q on $V_{on}$ is given in Table 1. In type A, the first emitter layer has an impurity concentration $N_E$ of $3 \times 10^{16}$ cm$^{-3}$ and a thickness W of 1 μm. $J_E$ and $J_C$ denote current densities of the emitter and the collector, respectively.

The opposite conclusion described above is based on the following reasoning. In general, in order to switch the bipolar transistor at a high speed, the emitter and collector current densities must be set from $10^3$ to $10^4$ A/cm$^2$ or higher. This fact is apparent from various experiments and from analytical results using the numerical analysis model. With the transistor of type A having the first emitter layer of a low-impurity concentration, the capability to inject carriers from the emitter to the base is smaller than that of type B. In order to obtain predetermined emitter and collector current densities, a high forward-bias voltage must be applied across the emitter-base junction. Under this operating condition, excess carriers are stored in the thick first emitter layer and the collector layer. As a result, the turn-off time is increased, and hence the propagation delay time is increased.

In fine, the emitter junction capacitance $C_{JE}$ of type A is smaller than that of type B, but the switching speed of type A is lower than that of type B. This result implies that both the emitter junction capacitance $C_{JE}$ and a total emitter capacitance $C_E=C_{JE}+C_{DE}$ must be considered as factors in determining the switching speed of the transistor, where $C_{DE}$ is known as the emitter diffusion capacitance, which is determined by the excess carrier charge. Since the thick first emitter layer of a low-impurity concentration is formed in the conventional heterostructure bipolar transistor, $C_{DE}$ is greater than $C_{JE}$. An effect of a small $C_{JE}$ cannot be observed under the influence of $C_{DE}$ with respect to the switching speed.

It is apparent that type B is preferred to type A from the point of view of switching speed. However, since type B has the emitter layer of a high-impurity concentration directly formed on the base layer, the breakdown voltage of the emitter junction is very low. The breakdown of a p-n junction mainly occurs due to the avalanche phenomenon. Even if the avalanche phenomenon is prevented, however, breakdown can also occur due to the tunneling effect. In particular, in the heterostructure bipolar transistors, a current caused by the tunneling effect consists of a component controlled by a number of interface levels generated at the heterojunction interface, in addition to a component determined by the direct transition of carriers between energy bands. For this reason, in practice, a tunneling current often becomes greater than a theoretical value. As a result, the emitter-junction breakdown voltage becomes very low.

In "A Depletion Stop Double Base Phototransistor: A Demonstration of a New Transistor Structure" by C. Y. Chen et al., IEDM 81, PP. 267–270, are disclosed a double base structure for phototransistors which is composed of a lightly doped layer near the emitter junction and a heavily doped layer near the collector junction, and a double-emitter double-base structure which is composed of lightly doped base and emitter layers near the emitter junction, heavily doped base and emitter layers far from the emitter junction. However, no specific formula to define the layer concentration and thickness is given. In addition, in the prior art device, a problem caused by excess carrier charge is left unsolved. It is noted that the phototransistor differs from the bipolar transistor of the present invention.

SUMMARY OF THE INVENTION

It is an object of the present invention to provide an improved heterostructure bipolar transistor with a high switching speed.

It is another object of the present invention to provide an improved heterostructure bipolar transistor having a high breakdown voltage.

In order to achieve the above objects of the present invention, there is provided a heterostructure bipolar transistor comprising an emitter layer, a base layer and a collector layer. The emitter layer being formed of a semiconductor material whose energy gap is wider than that of said base layer, so that a heterojunction is formed between the emitter layer and the base layer. The present invention is characterized in that one of said emitter layer and said base layer comprises first and second layers which are sequentially formed, the first layer constituting the heterojunction has a lower impurity concentration than that of the second layer, and when the impurity concentration and the thickness of the first layer are defined as $N_1$ and $W_1$, respectively, the following relation is satisfied:

$$N_1 W_1^2 \leq (2\epsilon_{s1}\epsilon_0/q)V_{bi}$$

where
  q: the absolute value of electron charge
    ($=1.6 \times 10^{-19}$ Coulombs)
  $\epsilon_0$: the free space permittivity
    ($=8.86 \times 10^{-14}$ farads/cm)
  $\epsilon_{s1}$: the dielectric constant of the first layer
  $V_{bi}$: the built-in potential at the heterojunction.

In addition, the other of the aforementioned emitter layer or the base layer comprises third and fourth layers which are sequentially formed, and third layer constituting the heterojunction has a lower impurity concentration than that of the fourth layer. When the impurity concentration and the thickness of the third layer are defined as $N_2$ and $W_2$, respectively, the following relation is satisfied:

$$N_1 W_1^2/\epsilon_{s1} + N_2 W_2^2/\epsilon_{s2} \leq (2\epsilon_0/q)V_{bi}$$

where
  q: the absolute value of electron charge
    ($=1.6 \times 10^{-19}$ Coulombs)
  $\epsilon_0$: the free space permittivity
    ($=8.86 \times 10^{-14}$ farads/cm)
  $\epsilon_{s1}$: the dielectric constant of the first layer
  $\epsilon_{s2}$: the dielectric constant of the third layer
  $V_{bi}$: the built-in potential at the heterojunction.

According to the arrangement described above, a heterostructure bipolar transistor which is improved in the switching speed and voltage withstanding property can be obtained. In addition, various problems caused by excess carrier storage can be solved.

BRIEF DESCRIPTION OF THE DRAWINGS

Other objects and advantages will be apparent from the following description taken in conjunction with the accompanying drawings, in which:

FIGS 5A to 5C are respectively graphs showing the impurity concentration distribution and the electric field distribution of base and emitter layers so as to explain the theoretical background of a first embodiment of the present invention;

FIGS. 9A to 9C are respectively graphs showing the impurity concentration distribution and the electric field distribution of base and emitter layers so as to explain the theoretical background of a third embodiment of the present invention.

DETAILED DESCRIPTION OF THE PREFERRED EMBODIMENTS

Figure 1:
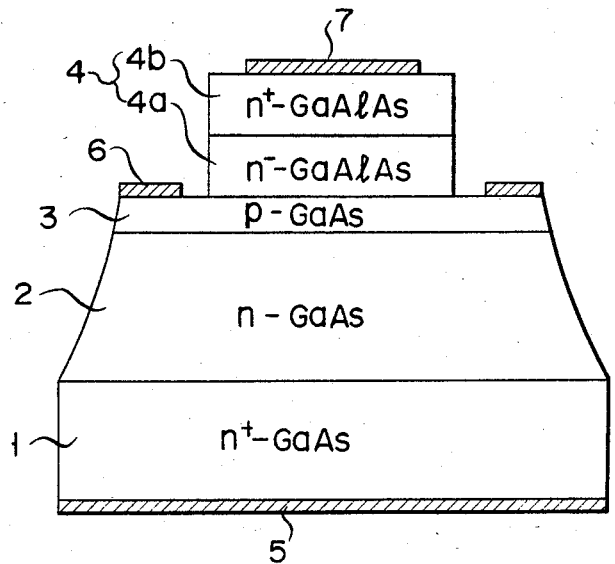
FIG. 1 is a sectional view of a conventional heterostructure bipolar transistor.
Figure 2:
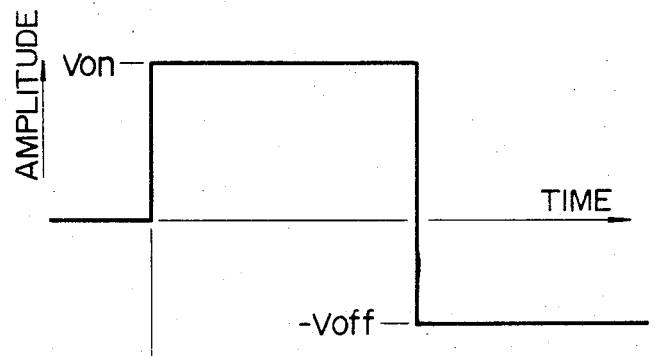
FIGS. 2 and 3 are respectively timing charts for clarifying the concept of the switching speed of a transistor.
Figure 3:
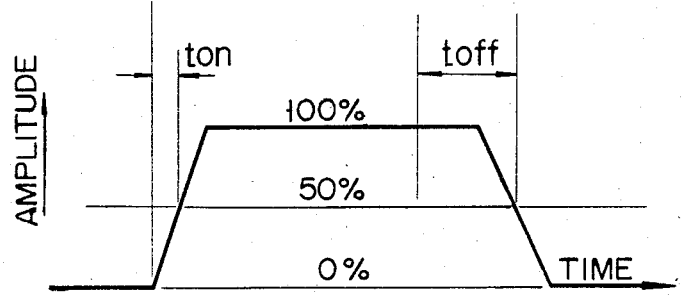
Figure 4:
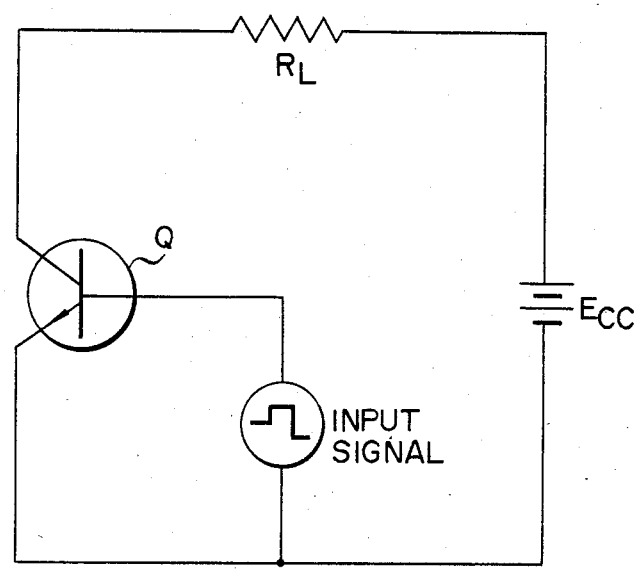
FIG. 4 is a diagram of a circuit used for numerically analyzing the switching speed of a transistor.

The theoretical background of a first embodiment will be described with reference to FIGS. 5A to 5C. When a zero volt is applied across an emitter-base heterojunction, an internal potential difference across this junction is a built-in potential $V_{bi}$. The electric field distribution of the heterojunction caused by the built-in potential $V_{bi}$ becomes as shown in FIGS. 5A to 5C. FIG. 5A shows the case wherein a thickness W of a first emitter layer is sufficiently large, FIG. 5B shows the case wherein the thickness W of the first emitter layer is the same as a thickness $W_{dep}$ of a depletion layer caused by the internal potential difference, and FIG. 5C is the case wherein the thickness W of the first emitter layer is smaller than the thickness $W_{dep}$. When an impurity concentration $N_E$ of the first emitter layer is much lower than an impurity concentration $N_B$ of the base layer, the case shown in FIGS. 5A and 5B respectively are known to satisfy the following equations:

$$E^{(0)}{}_{max}=(qN_E/\epsilon_{sE}\epsilon_0)W_{dep} \quad (1)$$

$$(E^{(0)}{}_{max}W_{dep})/2=V_{bi} \quad (2)$$

Elimination of $E^{(0)}{}_{max}$ from equations (1) and (2) yields $$N_E W_{dep}{}^2=(2\epsilon_{sE}\epsilon_0/q)V_{bi} \quad (3)$$

Similarly, the case shown in FIG. 5C satisfies the following equations:

$$E_{max}-E_{min}=(q/\epsilon_{sE}\epsilon_0)N_E W_E \quad (4)$$

$$E_{min}W_E+(E_{max}-E_{min})W_E/2=V_{bi} \quad (5)$$

Deriving $E_{max}$ from these equations:

$$E_{max}=(qN_E/2\epsilon_{sE}\epsilon_0)W_E+V_{bi}/W_E \quad (6)$$

ps where $E_{max}$ and $E_{min}$ are the maximum and minimum electric fields, respectively, in the first emitter layer.

Under the assumptions described above, equation (7) can be derived so as to maximize the switching speed under constraint that W does not exceed $W_{dep}$ at zero applied voltage as given by equation (3), and so as to set $W_E$ such that $E_{max}$ in equation (6) does not exceed the maximum allowable electric field of the heterojunction:

$$N_E W_E{}^2 \geqq (2\epsilon_{sE}\epsilon_0/q)V_{bi} \quad (7)$$

The built-in potential $V_{bi}$ of the heterojunction between the first emitter layer and the base layer is given as follows:

$$V_{bi}=(kT/q)ln\square N_E N_B/n_i(T)^2\nabla+(\chi_B-\chi_E)/q \quad (8)$$

where k is Boltzmann's constant, T is absolute temperature, $N_B$ is the impurity concentration of the base layer, $n_i(T)$ is the intrinsic electron density of the base layer, $\chi_B$ is the electron affinity of the base layer, and $\chi_E$ is the electron affinity of the first emitter layer. In equation (8), the first term on the right-hand side is common to both the homojunction and the heterojunction, and the second term on the right-hand side is inherent to the heterojunction.

When the first emitter layer consists of n-type $Ga_{0.7}Al_{0.3}As$ and the base layer consists of p-type GaAs, the built-in potential $V_{bi}$ varies in accordance with various combinations of the impurities, as shown in Table 2.

TABLE 2

| $N_E$ (cm$^{-3}$) | $N_B$ (cm$^{-3}$) | $V_{bi}$ (V) |
|---|---|---|
| $3 \times 10^{14}$ | $10^{18}$ | 1.40 |
| $1 \times 10^{15}$ | $10^{18}$ | 1.43 |
| $3 \times 10^{16}$ | $10^{18}$ | 1.52 |
| $1 \times 10^{17}$ | $10^{18}$ | 1.55 |

TABLE 2-continued

| $N_E$ (cm$^{-3}$) | $N_B$ (cm$^{-3}$) | $V_{bi}$ (V) |
|---|---|---|
| $5 \times 10^{17}$ | $10^{18}$ | 1.59 |

Figure 6:
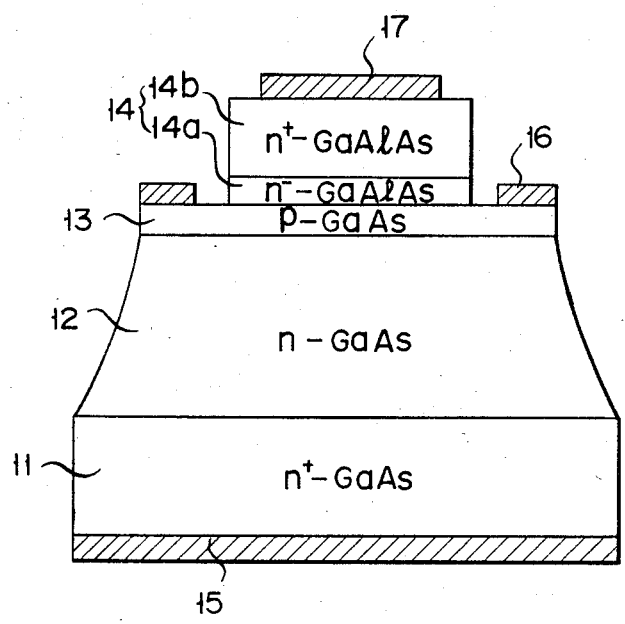
FIG. 6 is a sectional view of a heterostructure bipolar transistor according to the first embodiment of the present invention.

A first embodiment of the present invention will now be described. A bipolar transistor having a GaAlAs-GaAs structure is shown in FIG. 6. The steps in manufacturing this bipolar transistor will be described. An n+-type GaAs substrate 11 is used as the starting substrate. An n-type Si-doped GaAs collector layer 12 is formed by the epitaxial growth method on the GaAs substrate 11. With this process, a homojunction is to be formed between the collector and base layer. However, if a heterojunction is to be introduced for the collector-base junction, an n-type $Ga_{1-x}Al_xAs$ layer may be formed on the GaAs substrate 11. In both cases, molecular beam epitaxy (MBE) or metal-organic chemical vapor deposition (MOCVD) is preferably used for the epitaxial growth. In the subsequent processes, either method may be applied. Thereafter, a p-type Be-doped GaAs base layer 13 with relatively high impurity concentration is formed by the exptaxial growth method on the collector layer 12. The base layer 13 preferably has a thickness of 1,000 Å or less in order to achieve high-speed switching operation. A first emitter layer 14a of lightly doped n-type and a second emitter layer 14b of heavily doped n+-type $Ga_{1-x}Al_xAs$ are sequentially formed by the epitaxial growth method on the base layer 13. In this case, Si is used as the impurity, and the relationship between the concentration and the thickness of the first emitter layer 14a must satisfy equation (7). The resultant structure is selectively etched to leave only a central portion of the emitter, thereby exposing a peripheral portion of the surface of the base layer 13. Collector, base, and emitter electrodes 15, 16 and 17 are formed as shown to prepare the heterostructure bipolar transistor.

More specifically, the first emitter layer 14a consists of $Ga_{0.7}Al_{0.3}As$ layer which has an energy gap of 1.80 eV, a donor concentration $N_E$ of $3 \times 10^{16}$ cm$^{-3}$ and a thickness $W_E$ of 0.1 μm. On the other hand, the base layer 13 consists of GaAs layer which has an energy gap of 1.42 eV and an acceptor concentration $N_B$ of $10^{18}$ cm$^{-3}$. In this case, the built-in potential $V_{bi}$ at at temperature of T=300° K. becomes 1.52 V when $\chi_E$=3.77 eV; $\chi_B$=4.07 eV and $n_i(T)$=1.101×10$^7$ cm$^{-3}$ are substituted in equation (8).

When a zero voltage is applied between the emitter and base layers, the thickness $W_{dep}$ and the maximum electric field $E^{(0)}{}_{max}$ of the depletion layer to be extended when the first emitter layer 14a is sufficiently thick are obtained from equations (1) and (2) such that $W_{dep}$=0.260 μm and $E^{(0)}{}_{max}$=1.17×10$^5$ V/cm. In this case, the dielectric constant $\epsilon_{sE}$ of the second emitter layer is 12.0. However, since $W_E$=0.1 μm, $W_E<W_{dep}$. In this case, the maximum electric field $E_{max}$ is 1.75×10$^5$ V/cm from equation (6). A maximum electric field $E^*{}_{max}$ allowable without generating junction breakdown at the impurity concentration $N_E$ of $3 \times 10^{16}$ cm$^{-3}$ is about 5.1×10$^5$ V/cm (S. M. Sze, "Physics of Semiconductor Devices", 1969, Wiley-Interscience). Since the above $E_{max}$ is lower than $E^*{}_{max}$, the above-mentioned design conditions which satisfy equation (7) are meaningful in practice. In fact, an applied voltage such that $E_{max}=E_{max}$ is about 3.3 V, ensuring a sufficient voltage-withstanding property.

Another device may be prepared using the same materials described above but under different conditions, namely: $N_E=10^{17}$ cm$^{-3}$, $W_E=0.1$ μm, and $N_B=10^{18}$ cm$^{-3}$. In this case, $V_{bi}=1.55$ V, $W_{dep}=0.144$ μm, and $E^{(0)}{}_{max}=2.16\times10^5$ V/cm. At this time, $W_E<W_{dep}$, and $E_{max}=2.30\times10^5$ V/cm. Since the maximum allowable electric field $E^*{}_{max}$ corresponding to the impurity concentration of $10^{17}$ cm$^{-3}$ is about $6.4\times10^5$ V/cm, the resultant device can be used in practice. An allowable applied voltage is about 4.0 V, so that a sufficient voltage-withstanding property is ensured.

The switching characteristics of the two devices described above, which are obtained by numerical analysis, are shown in Table 3. The circuit conditions are the same as those in Table 1.

Comparing these results with those in Table 1, the switching characteristics of the two devices are slightly inferior to those of type B but are far superior to those of type A. Unlike type B wherein the emitter-base voltage withstanding property is poor, the embodiment of the present invention can easily provide a practically sufficient voltage withstanding property.

In this embodiment, the emitter layer of a wide energy gap may consist of GaP, and the base layer of a narrow energy gap may consist of Si. Alternatively, the emitter layer consist of GaAs, and the base layer may consist of Ge.

TABLE 3

| $N_E$ (cm$^{-3}$) | $3\times10^{16}$ | $10^{17}$ |
|---|---|---|
| $V_{on}$ (V) | 1.45 | 1.4 |
| $J_E$ (A/cm$^2$) | $9.21\times10^3$ | $9.12\times10^3$ |
| $J_C$ (A/cm$^2$) | $9.04\times10^3$ | $8.94\times10^3$ |
| $t_{on}$ (psec) | 10 | 13 |
| $t_{off}$ (psec) | 26 | 17 |
| $t_{pd}$ (psec) | 18 | 15 |

Figure 7A:
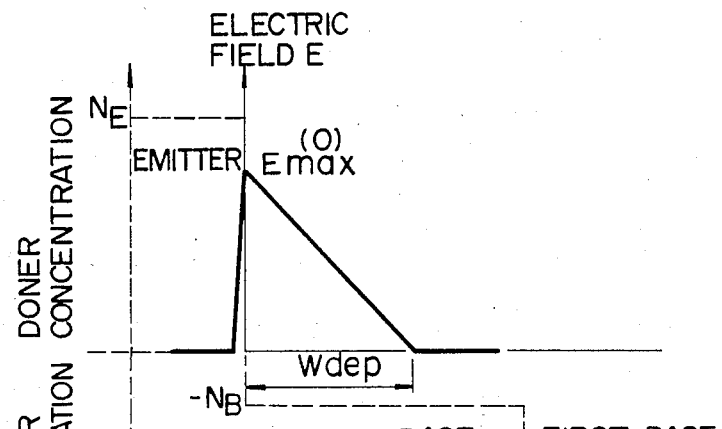
FIGS. 7A to 7C Are respectively graphs showing the impurity concentration distribution and the electric field distribution of base and emitter layers so as to explain the theoretical background of a second embodiment of the present invention.
Figure 7B:
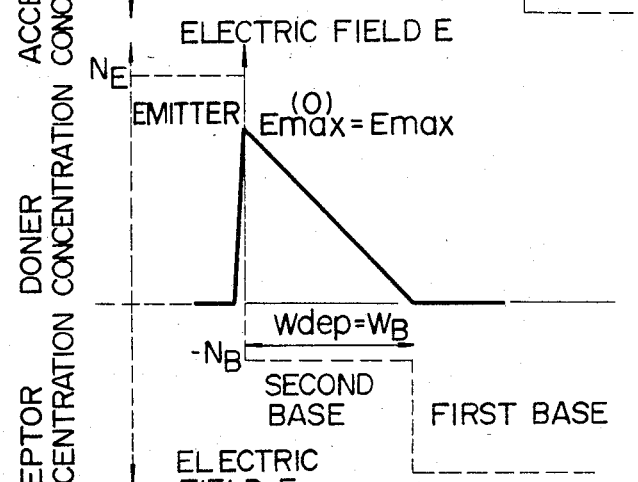
Figure 7C:
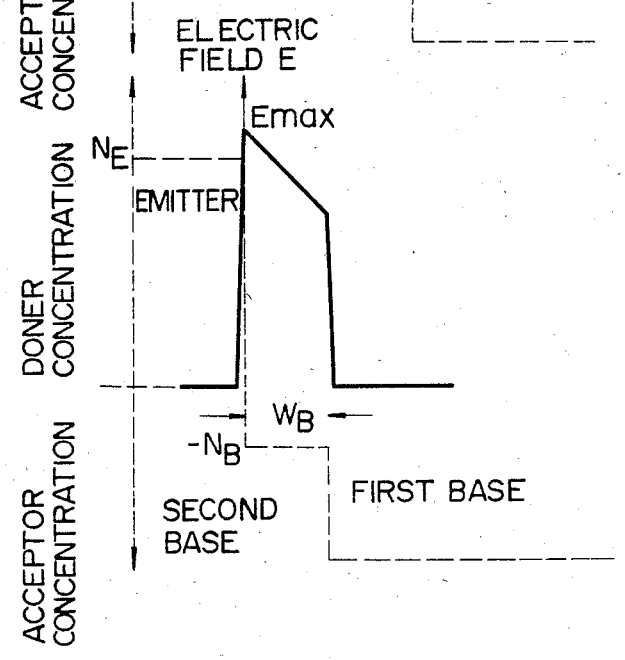

The theoretical background of a second embodiment of the present invention will be described with reference to FIGS. 7A to 7C. When a zero volt is applied to a heterojunction between the emitter and the base, an internal potential difference across this junction is $V_{bi}$. An electric field distribution of the heterojunction, caused by $V_{bi}$, is shown as in FIGS. 7A to 7C. FIG. 7A shows the case wherein a thickness $W_B$ of a second base layer of a low-impurity concentration is sufficiently large, FIG. 7B shows the case wherein $W_B$ of the second base layer is the same as a thickness $W_{dep}$ of a depletion layer caused by the internal potential difference, and FIG. 7C is the case wherein $W_B$ is smaller than $W_{dep}$. When the impurity concentration $N_E$ of the first emitter layer is much higher than the impurity concentration $N_B$ of the base layer, the cases shown in FIGS. 7A and 7B respectively satisfy the following equations:

$$E_{max}{}^{(0)}=(qN_B/\epsilon_{sB}\epsilon_0)W_{dep} \quad (9)$$

$$(E_{max}{}^{(0)}W_{dep})/2=V_{bi} \quad (10)$$

Elimination of $E_{max}{}^{(0)}$ from equations (9) and (10) yields $$N_BW_{dep}{}^2=(2\epsilon_{sB}\epsilon_0/q)V_{bi} \quad (11)$$

Similarly, the case shown in FIG. 7C satisfies the following equations:

$$E_{max}-E_{min}=(q/\epsilon_{sB}\epsilon_0)N_BW_B \quad (12)$$

$$E_{min}W_B+(E_{max}-E_{min})W_B/2=V_{bi} \quad (13)$$

Deriving $E_{max}$ from these equations:

$$E_{max}=(qN_B/2\epsilon_{sB}\epsilon_0)W_B+V_{bi}/W_B \quad (14)$$

where $E_{max}$ and $E_{min}$ are the maximum and minimum electric fields in the second base layer, respectively.

Under the assumptions described above, equation (15) can be derived so as to maximize the switching speed under constraint that W does not exceed $W_{dep}$ at zero applied voltage as given by equation (11) and so as to set $W_B$ such that $E_{max}$ in equation (14) does not exceed the maximum allowable electric field of the heterojunction:

$$N_BW_B{}^2\leq(2\epsilon_{sB}\epsilon_0/q)V_{bi} \quad (15)$$

The built-in potential $V_{bi}$ of the heterojunction between the second base layer and the emitter layer is given as follows:

$$V_{bi}=(kT/q)\ln\{N_EN_B/n_i(T)^2\}+(\chi_B-\chi_E)/q \quad (16)$$

where k is Boltzmann's constant, T is absolute temperature, $N_E$ is the impurity concentration of the emitter layer, $n_i(T)$ is the intrinsic electron density of the second base layer, $\chi_B$ is the electron affinity of the second base layer, and $\chi_E$ is the electron affinity of the emitter layer. In equation (16), the first term on the right-hand side is common to both the homojunction and the heterojunction, and the second term on the right-hand side is inherent to the heterojunction.

When the emitter layer consist of n-type $Ga_{0.7}Al_{0.3}As$ and the second base layer consists of p-type GaAs, the built-in potential $V_{bi}$ varies in accordance with various combinations of the impurities, as shown in Table 4.

TABLE 4

| $N_E$ (cm$^{-3}$) | NB (cm$^{-3}$) | $V_{bi}$ (V) |
|---|---|---|
| $10^{20}$ | $3\times10^{14}$ | 1.52 |
| $10^{20}$ | $1\times10^{15}$ | 1.55 |
| $10^{20}$ | $3\times10^{16}$ | 1.64 |
| $10^{20}$ | $1\times10^{17}$ | 1.67 |
| $10^{20}$ | $5\times10^{17}$ | 1.71 |

Figure 8:
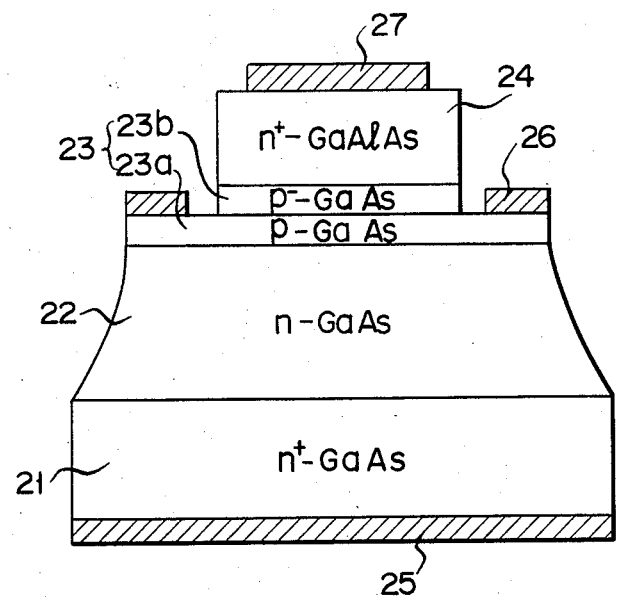
FIG. 8 is a sectional view of a heterostructure bipolar transistor according to the second embodiment of the present invention.

The second embodiment of the present invention will now be described. A bipolar transistor having a GaAlAs-GaAs structure is shown in FIG. 8. The steps in manufacturing this bipolar transistor will be described. An n+-type GaAs substrate 21 is used as the starting substrate. An n-type Si-doped GaAs collector layer 22 is formed by the epitaxial growth method on the GaAs substrate 21. with this process, a homojunction is to be formed between the collector and base layers. However, if a heterojunction is to be introduced for the collector-base junction, an n-type $Ga_{1-x}Al_xAs$ layer may be formed on the GaAs substrate 21. In both cases, molecular beam epitaxy or metal-organic chemical vapor deposition is preferably used for the expitaxial growth. In the subsequent processes, either method may be applied. Thereafter, a p-type Be-doped GaAs first base layer 23a is formed by the exptaxial method on the collector layer 22. The first base layer 23a preferably has a thickness of 1,000 Å or less in order to achieve high-speed switching. A p−-type GaAs second base layer 23b and an n+-type $Ga_{1-x}Al_xAs$ emitter layer 24 are sequentially formed by the epitaxial growth method on the first base layer 23a. In this case, the relationship between the concentration and the thickness of the second base layer 23b must satisfy equation (15). The resultant structure is selectively etched to leave only a central portion of the emitter, thereby exposing a peripheral portion of the surface of the first base layer 23a. Collector, base, and emitter electrodes 25, 26, and 27 are deposited to prepare the heterostructure bipolar transistor.

In particular, the emitter layer 24 consists of $Ga_{0.7}Al_{0.3}As$ which has an energy gap of 1.80 eV and a donor concentration $N_E$ of $10^{20}$ cm$^{-3}$. On the other hand, the second base layer 23b consists of GaAs which has an energy gap of 1.42 eV, an acceptor concentration $N_B$ of $3 \times 10^{16}$ cm$^{-3}$, and a thickness $W_B$ of 0.1 µm. In this case, the built-in potential $V_{bi}$ at a temperature of T=300° K. is 1.64 V when $\chi_E$=3.77 eV, $\chi_B$=4.07 eV, and $n_i(T) = 1.101 \times 10^7$ cm$^{-3}$ are substituted in equation (16).

When a zero volt is applied between the emitter and base layers, the thickness $W_{dep}$ and the maximum electric field $E_{max}^{(0)}$ of the depletion layer to be extended when the second base layer 23b is sufficiently thick are obtained from equations (9) and (10) such that $W_{dep}$=0.279 µm and $E_{max}^{(0)}$=1.17×10$^5$ V/cm. In this case, the dielectric constant $\epsilon_{sB}$ of the GaAs second base is 12.9. However, since $W_B$=0.1 µm, $W_B < W_{dep}$. In this case, the maximum electric field $E_{max}$ is $E_{max}$=1.85×10$^5$ V/cm from equation (14). A maximum electric field $E^*_{max}$ allowable without generating junction breakdown at the impurity concentration $N_B$ of 3×10$^{16}$ cm$^{-3}$ is about 5.1×10$^5$ V/cm. Since $E_{max}$ is lower than $E^*_{max}$, the above-mentioned design conditions which satisfy equation (15) are meaningful in practice. An applied voltage such that $E_{max}=E^*_{max}$ is 3.2 V.

Another device may be prepared using the same materials described above but under different conditions, namely: $N_E$=10$^{20}$ cm$^{-3}$, $N_B$=10$^{17}$ cm$^{-3}$ and $W_B$=0.1 µm. In this case, $V_{bi}$=1.67 V, $W_{dep}$=0.154 µm, and $E_{max}^{(0)}$=2.16×10$^5$ V/cm are obtained. Therefore, $W_B < W_{dep}$ and $E_{max}$=2.37×10$^5$ V/cm. Since the maximum allowable electric field $E^*_{max}$ corresponding to the impurity concentration of 10$^{17}$ cm$^{-3}$ is about 6.4×10$^5$ V/cm, the resultant device can be used in practice. An allowable applied voltage is about 4.0 V, thereby providing a sufficient voltage withstanding property as in the above devices.

The switching characteristics of the two devices described above, which are obtained by numerical analysis, are shown in Table 5. The circuit conditions are the same as those in Table 1.

TABLE 5

| | | |
|---|---|---|
| $N_B$ (cm$^{-3}$) | 3 × 10$^{16}$ | 10$^{17}$ |
| $V_{on}$ (V) | 1.4 | 1.4 |
| $J_E$ (A/cm$^2$) | 1.77 × 10$^4$ | 1.75 × 10$^4$ |
| $J_C$ (A/cm$^2$) | 9.70 × 10$^3$ | 9.70 × 10$^3$ |
| $t_{on}$ (psec) | 3.8 | 4.2 |
| $t_{off}$ (psec) | 21 | 21 |
| $t_{pd}$ (psec) | 12.4 | 12.6 |

Comparing these results with those in Table 1, the switching characteristics of the two devices are slightly inferior to those of type B but are far superior to those of type A. Unlike type B wherein the emitter-base voltage withstanding property is poor, the embodiment of the present invention can easily provide a practically acceptable voltage withstanding property.

In this embodiment, the emitter layer of a wide energy gap may consist of GaP, and the base layer of a narrow energy gap may consist of Si. Alternatively, the emitter layer may consist of GaAs, and the base layer may consist of Ge.

The theoretical background of a third embodiment of the present invention will now be described with reference to FIGS. 9A to 9C.

When a zero volt is applied across the heterojunction between the emitter and the base, the internal potential difference appearing across the junction is $V_{bi}$. The electric field distribution of the heterojunction caused by the potential difference becomes as shown in FIGS. 9A to 9C. FIG. 9A shows the case wherein a thickness $W_E$ of a first emitter layer and a thickness $W_B$ of the second base layer are sufficiently large, FIG. 9B shows the case wherein the thicknesses $W_E$ and $W_B$ of the first emitter layer and the second base layer are equal to thicknesses $W_{E,dep}$ and $W_{B,dep}$ of depletion layers formed by the internal potential differences, respectively, and FIG. 9C shows the case wherein the thicknesses $W_E$ and $W_B$ of the first emitter layer and the second base layer are smaller than thicknesses $W_{E,dep}$ and $W_{B,dep}$ of the depletion layers. In the cases shown in FIGS. 9A and 9B, equations (17), (18), and (19) are obtained in accordance with a known theory:

$$E_{max}^{(0)} = (qN_E/\epsilon_{sE}\epsilon_0)W_{E,dep} \qquad (17)$$

$$E_{max}^{(0)}(W_{E,dep} + W_{B,dep})/2 = V_{bi} \qquad (18)$$

$$N_E W_{E,dep}/\epsilon_{sE} = N_B W_{B,dep}/\epsilon_{sB} \qquad (19)$$

Elimination of $E_{max}$ from equations (17) and (18) yields:

$$N_E W_{E,dep}^2/\epsilon_{sE} + N_B W_{B,dep}^2/\epsilon_{sB} = (2\epsilon_0/q)V_{bi} \qquad (20)$$

Similarly, the case shown in FIG. 9C satisfies equations (21), (22) and (23):

$$E_{max} - E_{min,E} = qN_E W_E/\epsilon_{sE}\epsilon_0 \qquad (21)$$

$$E_{max} - E_{min,B} = qN_B W_B/\epsilon_{sB}\epsilon_0 \qquad (22)$$

$$(E_{min,E} + E_{max})W_E/2 + (E_{min,B} + E_{max})W_B/2 = V_{bi} \qquad (23)$$

Obtaining $E_{max}$ from equations (21), (22), and (23), $$E_{max} = V_{bi}/(W_E + W_B) + q/2\epsilon_0 \times (N_E W_E^2/\epsilon_{sE} + N_B W_B^2/\epsilon_{sB})/(W_E + W_B) \qquad (24)$$

It should be noted that the maximum electric field in the depletion layers, the minimum electric field in the first emitter layer, and the minimum electric field in the second base layer are given as $E_{max}$, $E_{min,E}$ and $E_{min,B}$, respectively.

Under the assumption described above, equation (25) is derived so as to maximize the switching speed under constraint that $N_E W_E^2/\epsilon_{sE} + N_B W_B^2/\epsilon_{sB}$ does not exceed the left hand side of equation (20), and that $E_{max}$ in equation (24) does not exceed the maximum allowable electric field of the heterojunction:

$$N_E W_E^2/\epsilon_{sE} + N_B W_B^2/\epsilon_{sB} \leq (2\epsilon_0/q)V_{bi} \qquad (25)$$

The built-in potential $V_{bi}$ of the heterojunction between the second base layer and the first emitter layer is given as follows:

$$V_{bi} = (kT/q)\ln\{N_E N_B/n_i(T)^2\} + (\chi_B - \chi_E)/q \qquad (26)$$

where k is Boltzmann's constant, T is absolute temperature, $N_E$ is impurity concentration of the emitter layer, $n_i(T)$ is the intrinsic electron density of the base layer, $\chi_B$ is the electron affinity of the second base layer, and $\chi_E$ is the electron affinity of the first emitter layer. In equation (26), the first term in the right-hand side is common to both the homojunction and the heterojunction, and the second term on the right-hand side is inherent to the heterojunction.

When the first emitter layer consists of n-type $Ga_{0.7}Al_{0.3}As$ and the second base layer consists of p-type GaAs, the built-in potential $V_{bi}$ varies in accordance with various combinations of the impurities, as shown in Table 6.

TABLE 6

| $N_E$ (cm$^{-3}$) | $N_B$ (cm$^{-3}$) | $V_{bi}$ (V) |
|---|---|---|
| 3 × 10$^{16}$ | 3 × 10$^{16}$ | 1.43 |
| 3 × 10$^{16}$ | 1 × 10$^{17}$ | 1.46 |
| 3 × 10$^{16}$ | 1 × 10$^{18}$ | 1.52 |
| 1 × 10$^{17}$ | 1 × 10$^{17}$ | 1.49 |
| 1 × 10$^{17}$ | 1 × 10$^{18}$ | 1.55 |
| 1 × 10$^{18}$ | 3 × 10$^{16}$ | 1.52 |
| 1 × 10$^{18}$ | 1 × 10$^{18}$ | 1.61 |
| 1 × 10$^{19}$ | 3 × 10$^{16}$ | 1.58 |
| 1 × 10$^{19}$ | 1 × 10$^{17}$ | 1.61 |
| 1 × 10$^{19}$ | 1 × 10$^{18}$ | 1.67 |
| 1 × 10$^{20}$ | 3 × 10$^{16}$ | 1.64 |
| 1 × 10$^{20}$ | 1 × 10$^{17}$ | 1.67 |
| 1 × 10$^{20}$ | 1 × 10$^{18}$ | 1.73 |

Figure 10:
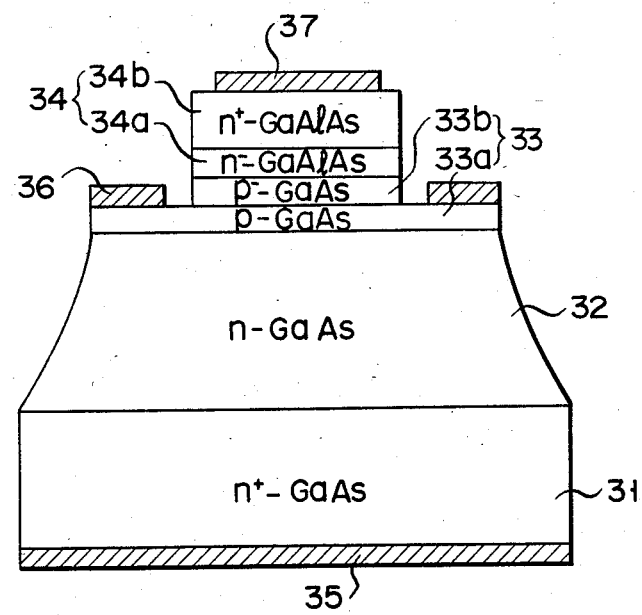
FIG. 10 is a sectional view of a heterostructure bipolar transistor according to the third embodiment of the present invention.

The third embodiment of the present invention will now be described. A bipolar transistor having a GaAlAs—GaAs structure is shown in FIG. 10. The steps in manufacturing this bipolar transistor will be described. An n+-type GaAs substrate 31 is used as the starting substrate. An n-type Si-doped GaAs collector layer 32 is formed by the epitaxial growth method on the GaAs substrate 31. With this process, a homojunction is to be formed between the collector and base layers. However, if a heterojunction is to be introduced, an n-type $Ga_{1-x}Al_xAs$ layer may be formed on the GaAs substrate 31. In both cases, molecular beam epitaxy or metal-organic chemical vapor deposition is preferably used for the epitaxial growth. In the subsequent processes, either method may be applied. Thereafter, a p-type Be-doped GaAs first base layer 33a and a p$^-$-type GaAs second base layer 33b are formed by the epitaxial growth method on the collector layer 32. A total thickness of the first and second base layers 33 is preferably 1,000 Å or less so as to achieve high-speed switching. Subsequently, an n$^-$-type $Ga_{1-x}Al_xAs$ first emitter layer 34a and an n+-type $Ga_{1-x}Al_xAs$ second emitter layer 34b are formed by the epitaxial growth method on the base layers 33. In this case, Si is used as the impurity, and the relationship between the concentration and thickness of the first emitter layer 34a and that of the second emitter layer 34b are both set to satisfy equation (25). Finally, etching is performed to leave only a central portion of the emitter layer and to expose the peripheral portion of the surface of the first base layer 33a. Collector, base, and emitter electrodes 35, 36, and 37 are formed to prepare the heterostructure bipolar transistor according to the third embodiment of the present invention.

In particular, the second emitter layer 34b consists of $Ga_{0.7}Al_{0.3}As$ which has an energy gap of 1.80 eV and a donor concentration $N_{E0}$ of $10^{20}$ cm$^{-3}$. The first emitter layer 34a consists of the same material as that of the second emitter layer 34b but has a donor concentration $N_E$ of $10^{17}$ cm$^{-3}$ and a thickness $W_E$ of 500 Å. On the other hand, the second base layer 33b consists of GaAs which has an acceptor concentration $N_B$ of 3×10$^{16}$ cm$^{-3}$, a thickness $W_B$ of 500 Å and an energy gap of 1.42 eV. The first base layer 33a consists of the same material as that of the second base layer 33b but has an acceptor concentration $N_{B0}$ of $10^{18}$ cm$^{-3}$. In this case, the built-in potential $V_{bi}$ at a temperature T of 300° K. is 1.46 V when $\chi_E=3.77$ eV, $\chi_B=4.07$ eV and $n_i(T)=1.101\times 10^7$ cm$^{-3}$ are substituted in equation (26).

The thicknesses $W_{E,dep}$ and $W_{B,dep}$ of the depletion layers, in the case when the first emitter layer and the second base layer are sufficiently thick, and the maximum electric field $E_{max}^{(0)}$ are $W_{E,dep}=651$ Å, $W_{B,dep}=2,332$ Å and $E_{max}^{(0)}=0.98\times 10^5$ V/cm from equations (17), (18) and (19), respectively. It should be noted that dielectric constants $\epsilon_{sE}$ and $\epsilon_{sB}$ of the emitter and base layers are 12.0 and 12.9, respectively. However, since $W_E=W_B=500$ Å, the left-hand side of equation (25) is calculated to be 2.66×10$^5$ (1/cm) and the right-hand side thereof is calculated to be 1.62×10$^6$ (1/cm), so that equation (25) is satisfied. In this case, the maximum electric field $E_{max}$ becomes 1.70×10$^5$ V/cm in accordance with equation (24). Since the maximum allowable electric field $E^*_{max}$ obtained without generating junction breakdown at the impurity concentration $N_E$ of 3×10$^{16}$ cm$^{-3}$ is about 5.1×10$^5$ V/cm, $E_{max}$ is smaller than $E^*_{max}$. Therefore, the design conditions satisfy equation (25) and can be used in practice. As a reference, an applied voltage for $E_{max}=E^*_{max}$ is about 3.3 V.

Another device may be formed using the same materials as described above, but under different manufacturing conditions, namely: $N_{E0}=10^{20}$ cm$^{-3}$, $N_E=10^{17}$ cm$^{-3}$, $N_{B0}=10^{18}$ cm$^{-3}$, $N_B=10^{17}$ cm$^{-3}$ and $W_E=W_B=500$ Å. In this case, $V_{bi}=1.49$ V, $W_{E,dep}=977$ Å and $W_{B,dep}=1,050$ Å, and $E_{max}^{(0)}=1.47\times 10^5$ V/cm. At the same time, the left-hand side of equation (25) is 4.02×10$^5$ (1/cm), and the right-hand side thereof is 1.65×10$^6$ (1/cm), thus satisfying equation (25). In addition, $E_{max}=2.49\times 10^5$ V/cm is given, but $E^*_{max}$ corresponding to the impurity concentration of 10$^{17}$ cm$^{-3}$ is about 6.4×10$^5$ V/cm. Thus, these design conditions can also be used in practice. The allowable applied voltage is about 4.5 V, thereby providing a sufficient voltage withstanding property.

The switching characteristics of the two devices described above, which are obtained by numerical analysis, are shown in Table 7. The circuit conditions are the same as those in Table 1.

TABLE 7

| $N_E$ (cm$^{-3}$) | 10$^{17}$ | 10$^{17}$ |
|---|---|---|
| $N_B$ (cm$^{-3}$) | 3 × 10$^{16}$ | 10$^{17}$ |
| $V_{on}$ (V) | 1.4 | 1.4 |
| $J_E$ (A/cm$^2$) | 1.21 × 10$^4$ | 1.20 × 10$^4$ |
| $J_C$ (A/cm$^2$) | 9.38 × 10$^3$ | 9.37 × 10$^3$ |
| $t_{on}$ (psec) | 7.5 | 8.5 |
| $t_{off}$ (psec) | 22 | 22 |
| $t_{pd}$ (psec) | 14.8 | 15.3 |

Comparing these results with those in Table 1, the switching characteristics of the two devices are slightly inferior to those of type B but are far superior to those of type A. Unlike type B wherein the emitter-base voltage withstanding property is poor, the embodiment according to the present invention can easily provide a practically sufficient voltage withstanding property.

In this embodiment, the emitter layer of a wide energy gap may consist of GaP, and the base layer of a narrow energy gap may consist of Si. Alternatively, the emitter layer may consist of GaAs, and the base layer may consist of Ge.

What is claimed is:

1. A heterostructure bipolar transistor comprising:
a collector layer of a first conductivity type;
a base multilayer of a second conductivity type which comprises first and second base layers sequentially formed on said collector layer, said first base layer constituting a junction with said collector layer, and an impurity concentration of said first base layer being higher than that of said second base layer; and
an emitter multilayer of the first conductivity type which comprises first and second emitter layers sequentially formed on said base multilayer, said emitter multilayer being formed of a semiconductor material whose energy gap is wider than that of said base multilayer, said second base layer constituting the heterojunction with said first emitter layer, and an impurity concentration of said first emitter layer being lower than that of said second emitter layer;
wherein the following relation is satisfied when the impurity concentration and the thickness of said first emitter layer are $N_E$ and $W_E$, and the impurity concentration and the thickness of said second base layer are $N_B$ and $W_B$, respectively:

$$N_E W_E^2/\epsilon_{sE} + N_B W_B^2/\epsilon_{sB} \leq (2\epsilon_0/q)V_{bi}$$

where
q: absolute value of electron charge ($=1.6 \times 10^{-19}$ Coulombs)
$\epsilon_0$: free space permittivity ($=8.86 \times 10^{-14}$ farads/cm)
$\epsilon_{sE}$: dielectric constant of said first emitter layer
$\epsilon_{sB}$: dielectric constant of said second base layer
$V_{bi}$: built-in potential at the heterojunction between said first emitter layer and said second base layer.

2. A transistor according to claim 1, wherein said emitter multilayer is formed of $Ga_{1-x}Al_xAs$, said base multilayer GaAs, and said collector layer GaAs.

3. A transistor according to claim 1, wherein said emitter multilayer is formed of $Ga_{1-x}Al_xAs$, said base multilayer GaAs, and said collector layer GaAlAs.

4. A heterostructure bipolar transistor comprising:
a collector layer of a first conductivity type;
a base multilayer of a second conductivity type which comprises first and second base layers sequentially formed on said collector layer, said first base layer constituting a junction with said collector layer, and an impurity concentration of said first base layer being higher than that of said second base layer; and
an emitter layer of the first conductivity type, said emitter layer being formed of a semiconductor material whose energy gap is wider than that of said base multilayer, and said second base layer constituting a heterojunction with said emitter layer;
wherein the following relation is satisfied when the impurity concentration and the thickness of said second base layer are $N_B$ and $W_B$, respectively:

$$N_B W_B^2 \leq (2\epsilon_{sB}\epsilon_0/q)V_{bi}$$

where
q: absolute value of electron charge ($=1.6 \times 10^{-19}$ Coulombs)
$\epsilon_0$: free space permittivity ($=8.86 \times 10^{-14}$ farads/cm)
$\epsilon_{sB}$: dielectric constant of said second base layer
$V_{bi}$: built-in potential at the heterojunction between said emitter layer and said second base layer.

5. A transistor according to claim 4, wherein said emitter layer is formed of $Ga_{1-x}Al_xAs$, said base multilayer GaAs, and said collector layer GaAs.

6. A transistor according to claim 4, wherein said emitter layer is formed of $Ga_{1-x}Al_xAs$, said base multilayer GaAs, and said collector layer GaAlAs.

7. A heterostructure bipolar transistor comprising:
a collector layer of a first conductivity type;
a base layer of a second conductivity type which is formed on said collector layer; and
an emitter multilayer of the first conductivity type which comprises first and second emitter layers sequentially formed on said base layer, said emitter multilayer being formed of a semiconductor material whose energy gap is wider than that of said base layer, said base layer constituting a heterojunction with said first emitter layer, and an impurity concentration of said first emitter layer being lower than that of said second emitter layer;
wherein the following relation is satisfied when the impurity concentration and the thickness of said first emitter layer are $N_E$ and $W_E$, respectively:

$$N_E W_E^2 \leq (2\epsilon_{sE}\epsilon_0/q)V_{bi}$$

where
q: absolute value of electron charge ($=1.6 \times 10^{-19}$ Coulombs)
$\epsilon_0$: free space permittivity ($=8.86 \times 10^{-14}$ farads/cm)
$\epsilon_{sE}$: dielectric constant of said first emitter layer
$V_{bi}$: built-in potential at the heterojunction between said first emitter layer and said base layer.

8. A transistor according to claim 7, wherein said emitter multilayer is formed of $Ga_{1-x}Al_xAs$, said base layer GaAs, and said collector layer GaAs.

9. A transistor according to claim 7, wherein said emitter multilayer is formed of $Ga_{1-x}Al_xAs$, said base layer GaAs, and said collector layer GaAlAs.

* * * * *